United States Patent
Lee et al.

(10) Patent No.: US 7,404,094 B2
(45) Date of Patent: Jul. 22, 2008

(54) RELAY SET IN NETWORK DEVICE AND METHOD THEREOF

(75) Inventors: Chao-Cheng Lee, Hsin-Chu (TW); Shian-Ru Lin, Nan-Tou-Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 368 days.

(21) Appl. No.: 11/308,117

(22) Filed: Mar. 7, 2006

(65) Prior Publication Data

US 2006/0202739 A1   Sep. 14, 2006

(30) Foreign Application Priority Data

Mar. 8, 2005   (TW) .............................. 94106943 A

(51) Int. Cl.
*G06F 1/00* (2006.01)

(52) U.S. Cl. ........................ 713/300; 713/310; 700/286; 700/297

(58) Field of Classification Search ................. 713/300, 713/310; 700/286, 297
See application file for complete search history.

(56) References Cited

U.S. PATENT DOCUMENTS

| | | | |
|---|---|---|---|
| 6,535,983 B1* | 3/2003 | McCormack et al. | 713/310 |
| 6,986,071 B2* | 1/2006 | Darshan et al. | 713/330 |
| 7,162,650 B2* | 1/2007 | Ke et al. | 713/300 |
| 2005/0086546 A1* | 4/2005 | Dadrshan et al. | 713/300 |
| 2006/0075173 A1 | 4/2006 | Mattur et al. | |
| 2006/0112288 A1* | 5/2006 | Shindler | 713/300 |
| 2007/0174527 A1* | 7/2007 | Vorenkamp | 710/100 |

OTHER PUBLICATIONS 802.3af, Jun. 18, 2003, The Institute of Electrical and Electronics Engineers Inc., pp. 37-41 and 86-88.*

* cited by examiner

*Primary Examiner*—Mark Connolly
(74) *Attorney, Agent, or Firm*—Winston Hsu

(57) ABSTRACT

A relay set in a network device. The relay includes a first switch, a switch control unit, and a first AC coupling unit. The first switch is coupled between a first receiving end of the network device and a first transmitting end of the network device. The switch control unit is configured to turn off the first switch when the network device is in a first state. The first AC coupling unit is configured to turn on the first switch according to a first signal received from the first receiving end when the network device is in a second state.

20 Claims, 2 Drawing Sheets

_US 7,404,094 B2_

RELAY SET IN NETWORK DEVICE AND METHOD THEREOF

BACKGROUND OF THE INVENTION

1. Field of the Invention

The present invention relates to network devices, and more particularly, to a technique of providing power to a network device.

2. Description of the Prior Art

Power over Ethernet (POE) is a technique that can be utilized to supply power to a network device through communication cable(s) of an Ethernet network. By utilizing this technique, the network device can obtain power required for operation through the communication cable(s) of the Ethernet network.

FIG. 1 shows a schematic diagram illustrating a Power over Ethernet (POE) system. A network 100 shown in FIG. 1 includes a first network device 110 and a second network device 120, both of which being capable of supporting the POE technique. More specifically, in this example the first network device 110 is a device for providing power, while the second network device 120 is a device being provided with power. For example, the first network device 110 is a switch and the second network device 120 is an end station.

The first network device 110 includes a power supplier (not shown), a transmitter 112 and a receiver 114. The second network device 120 includes a transmitter 124, a receiver 122, and a relay 126 shown in FIG. 1. The relay 126 is coupled to a first receiving end VIP, a second receiving end VIN, a first transmitting end VOP, and a second transmitting end VON of the second network device 120.

When required operational power is not yet provided to the second network device 120, the two switches in the relay 126 should be in "ON" states to let the first receiving ends VIP and VIN be interconnected with the first transmitting ends VOP and VON, respectively. Under these circumstances, a link pulse sent by the transmitter 112 will be returned to the receiver 114 (the link pulse returned to the receiver 114 is attenuated). If the first network device 110 receives the returned link pulse, according to the specification of the POE, the first network device 110 realizes that the second network device 120 supports the POE technique. The first network device 110 can then send power to the second network device 120 through the communication cables connected between the first network device 110 and the second network device 120. When the required operational power is already provided to the second network device 120, the two switches in the relay 126 should be in "OFF" states.

The block "relay 126" shown in FIG. 1 is only a conceptual block. The detailed circuit structure is more complicated than what is shown in FIG. 1, which includes only two switches. It is required to appropriately design the relay 126 utilized in the second network device 120 to let the POE function be properly carried out. Besides, it is also required to integrate the relay 126 in a chip to reduce the overall manufacturing cost.

SUMMARY OF THE INVENTION

An embodiment of the present invention provides a relay having a simple circuit structure for being utilized in a network device supporting the POE function.

In the embodiment, the relay comprises: a first switch coupled between a first receiving end of the network device and a first transmitting end of the network device; a switch control unit configured to turn off the first switch when the network device is in a first state; and a first AC coupling unit configured to turn on the first switch according to a first signal received from the first receiving end when the network device is in a second state.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
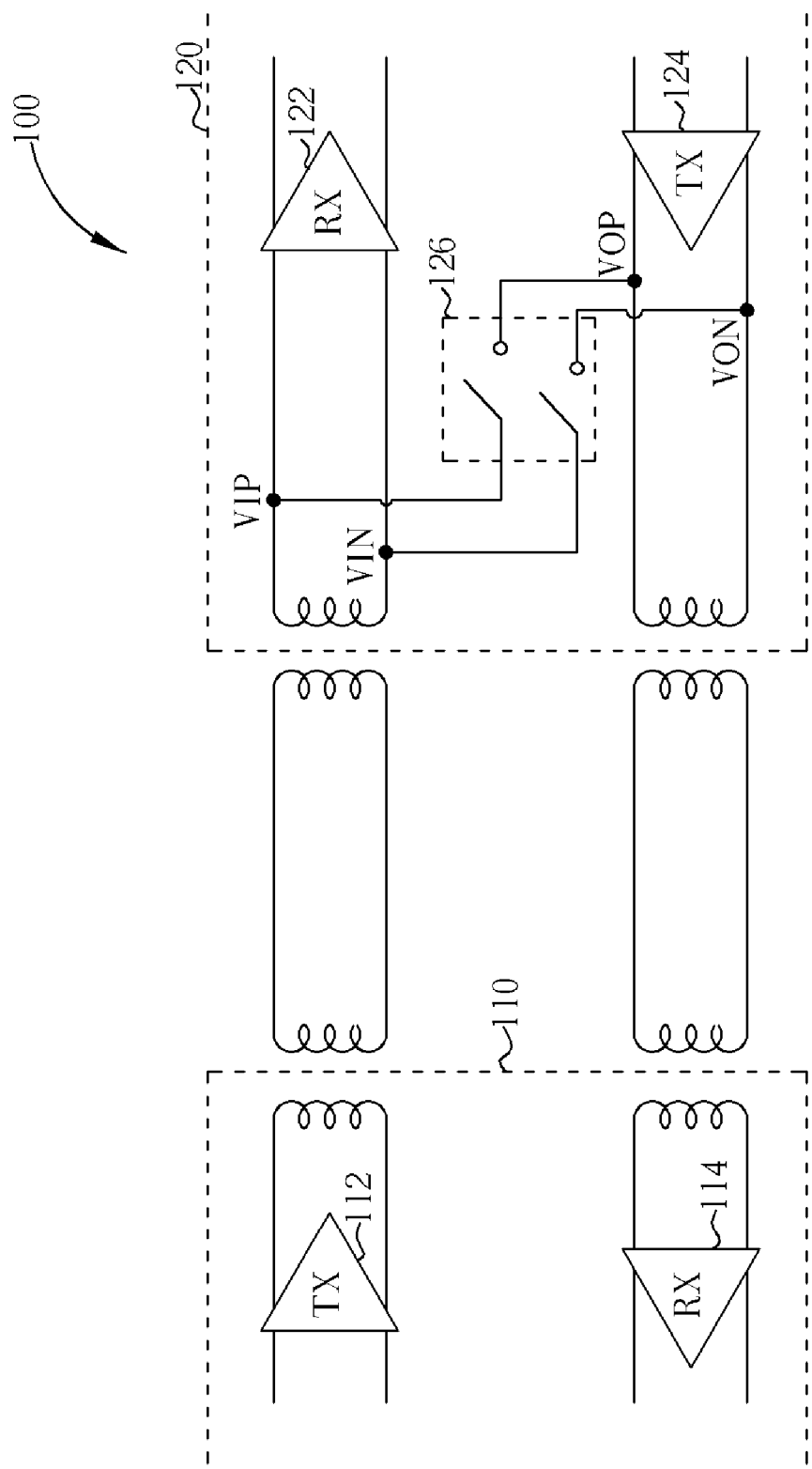
FIG. 1 shows a schematic diagram illustrating a Power over Ethernet (POE) system.
Figure 2:
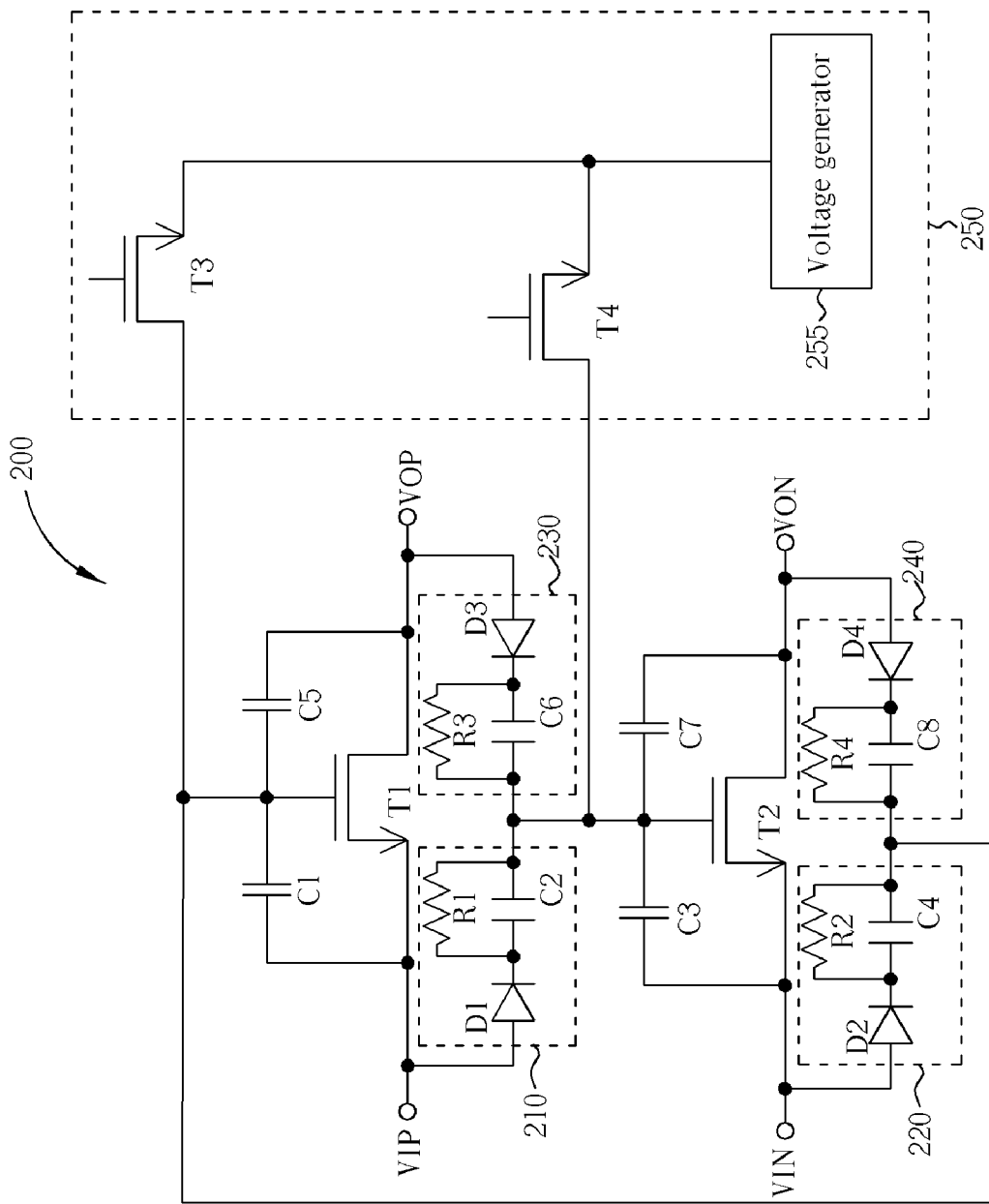
FIG. 2 shows a schematic diagram of a relay according to an embodiment of the present invention.

FIG. 2 shows a schematic diagram of a relay according to an embodiment of the present invention. The relay 200 of this embodiment can be set inside an Ethernet device.

The relay 200 is coupled to a first receiving end VIP, a second receiving end VIN, a first transmitting end VOP, and a second transmitting end VON of the Ethernet device. It is also possible that the two ends VOP and VON are two receiving ends of the Ethernet device, while the two ends VIP and VIN being two transmitting ends of the Ethernet device. The positive/negative relationship between the two ends VIP and VIN is reversible, as is the positive/negative relationship between the two ends VOP and VON. In a preferred embodiment, the relay 200 has a symmetrical structure. In the following descriptions, the first receiving end VIP is assumed to be a positive receiving end, the second receiving end VIN is assumed to be a negative receiving end, the first transmitting end VOP is assumed to be a positive transmitting end, and second transmitting end VON is assumed to be a negative transmitting end.

The relay 200 includes a first and a second switch, a first, a second, a third, a fourth, a fifth, a sixth, a seventh, and an eighth AC coupling unit, and a switch control unit 250. In this embodiment, the first and second switches are implemented by a first and a second transistor T1 and T2, respectively. The first and second ends of the first transistor T1 are coupled to the first receiving end VIP and the first transmitting end VOP of the Ethernet device, respectively. The first and second ends of the second transistor T2 are coupled to the second receiving end VIN and the second transmitting end VON of the Ethernet device, respectively. The first, third, fifth, and seventh AC coupling units are implemented by a first, a third, a fifth, and a seventh capacitor C1, C3, C5, and C7, respectively. The second AC coupling unit 210 includes a first diode D1, a first resistor R1, and a second capacitor C2. The fourth AC coupling unit 220 includes a second diode D2, a second resistor R2, and a fourth capacitor C4. The sixth AC coupling unit 230 includes a third diode D3, a third resistor R3, and a sixth capacitor C6. The eighth AC coupling unit 240 includes a fourth diode D4, a fourth resistor R4, and an eighth capacitor C8. The switch control unit 250 includes a voltage generator 255, a third switch (which is implemented by a third transistor T3), and a fourth switch (which is implemented by a fourth transistor T4). In an embodiment, the first and second transistors T1 and T2 are transistors with threshold voltages approaching zero volt. Since the coupling relationships between the elements of the relay 200 are clearly shown in FIG. 2, further description is omitted here.

The Ethernet device has a first state and a second state. The first state corresponds to a condition that the Ethernet device already has required power for operation. The second state corresponds to another condition that the Ethernet device does not have required power for operation. For example, the first state is a POE activated state, and the second state is a POE inactivated state.

In the second state, since the Ethernet device does not have required power for operation, the voltage generator 255 is not able to generate a control voltage, which is a negative voltage level VBIAS, to turn the first and second transistors T1 and T2 off. A first signal, which can be a positive link pulse of a differential link pulse, received by the first receiving end VIP, will be AC coupled to the control end of the first transistor T1 through the first capacitor C1. The first transistor T1 is therefore turned on. At this moment, the first signal will be able to pass through the first transistor T1 and reach the first transmitting end VOP. When another Ethernet device on the other side receives the returned link pulse, it can initiate the POE function to send power to the Ethernet device.

If the Ethernet device is provided with the required operational power, it is in the first state and the voltage generator 255 generates a control voltage, which is a negative voltage level VBIAS. Through the turned on third and fourth transistors T3 and T4, the negative voltage level VBIAS is sent to the control ends of the first and second transistors T1 and T2. The first and second transistors T1 and T2 are therefore turned off.

In another embodiment, when the first receiving end VIP receives the first signal, the second receiving end VIN also receives a second signal, which is a negative link pulse of the aforementioned differential link pulse. The second signal is AC coupled to the control end of the second transistor T2 through the third capacitor C3. However, the second signal is a negative pulse and might turn the second transistor T2 off. The second AC coupling unit 210 in this embodiment can make sure that the second transistor T2 will not be turned off. More specifically, through the second AC coupling unit 210, the first signal is also coupled the control end of the second transistor T2. On the control end of the second transistor T2, the first signal coupled through the second AC coupling unit 210 nullifies the second signal coupled through the third capacitor C3. Therefore, the second transistor T2 will not be turned off, and the second signal can pass through the second transistor T2 and reach the second transmitting end VON. In the second AC coupling unit 210, the first diode D1 permits positive pulses to pass while blocks negative pulses. The second capacitor C2 AC couples the positive pulses, which already passes through the first diode D1, to the control end of the second transistor T2. The first resistor R1 discharges residual electric charges in the second capacitor C2. The function of the fourth AC coupling unit 220 is similar to that of the second AC coupling unit 210. In this embodiment, the second signal received by the second receiving end VIN is a negative pulse, therefore the second signal will be blocked by the second diode D2 and will not be AC coupled to the control end of the first transistor T1 through the fourth AC coupling unit 220. Therefore the first transistor T1 will not be erroneously turned off according to the second signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A relay set in a network device, the relay comprising:
   a first switch coupled between a first receiving end of the network device and a first transmitting end of the network device;
   a switch control unit coupled to a control end of the first switch, configured to turn off the first switch when the network device is in a first state; and
   a first AC coupling unit coupled to the first receiving end and the control end of the first switch, configured to turn on the first switch according to a first signal received from the first receiving end when the network device is in a second state.

2. The relay of claim 1, further comprising:
   a second switch coupled between a second receiving end of the network device and a second transmitting end of the network device; and
   a second AC coupling unit, coupled to the first receiving end and a control end of the second switch, configured to turn on the second switch according to the first signal when the network device is in the second state;
   wherein the switch control unit turns off the second switch when the network device is in the first state.

3. The relay of claim 2, wherein the first switch is a first transistor and the second switch is a second transistor.

4. The relay of claim 3, wherein a threshold voltage of the first transistor substantially approximates 0 volt.

5. The relay of claim 3, wherein the first AC coupling unit is a first capacitor.

6. The relay of claim 5, wherein the second AC coupling unit comprises:
   a diode coupled to the first receiving end; and
   a second capacitor coupled between the diode and the control end of the second transistor.

7. The relay of claim 6, further comprising:
   a resistor coupled to the second capacitor in parallel.

8. The relay of claim 3, wherein the second AC coupling unit comprises:
   a diode coupled to the first receiving end; and
   a second capacitor coupled between the diode and the control end of the second transistor.

9. The relay of claim 2, wherein the switch control unit comprises:
   a voltage generator configured to generate a control voltage;
   a third switch coupled between the voltage generator and the control end of the first switch; and
   a fourth switch coupled between the voltage generator and the control end of the second switch;
   wherein the third and the fourth switches are turned on when the network device is in the first state.

10. The relay of claim 1, wherein the switch control unit comprises:
    a voltage generator configured to generate a control voltage; and
    a third switch coupled between the voltage generator and the control end of the first switch, wherein the third switch is turned on when the network device is in the first state.

11. The relay of claim 10, wherein the control voltage is a negative voltage.

12. The relay of claim 1, wherein the first signal is a link pulse.

13. The relay of claim 1, wherein the first switch is a first transistor and a threshold voltage of the first transistor substantially approximates 0 volt.

14. The relay of claim 1, wherein the first state corresponds to a power over Ethernet (POE) function activated state and the second state corresponds to a POE function inactivated state.

15. The relay of claim 1, wherein the relay is set inside a chip.

16. A method of supplying power to a network device, the method comprising:
  providing a relay, the relay comprising:
    a first switch coupled between a first receiving end of the network device and a first transmitting end of the network device;
    a switch control unit coupled to a control end of the first switch configured to control the first switch; and
    a first AC coupling unit coupled to the first receiving end and the control end of the first switch, configured to control the first switch;
  turning off the first switch when the network device is in a first state; and
  turning on the first switch according to a first signal received from the first receiving end when the network device is in a second state.

17. The method of claim 16, wherein the first switch is a first transistor, the step of turning off the first switch comprises:
  providing a negative voltage to a control end of the first transistor.

18. The method of claim 16, wherein the relay is set inside a chip.

19. The method of claim 16, wherein the relay further comprises:
  a second switch coupled between a second receiving end of the network device and a second transmitting end of the network device; and
  a second AC coupling unit coupled to the first receiving end and a control end of the second switch;
  wherein the method further comprises:
  turning off the second switch when the network device is in the first state; and
  turning on the second switch according to the first signal when the network device is in the second state.

20. The method of claim 16, wherein the first state corresponds to a power over Ethernet (POE) function activated state and the second state corresponds to a POE function inactivated state.

* * * * *